United States Patent [19]
Tsai et al.

[11] Patent Number: 5,858,854
[45] Date of Patent: *Jan. 12, 1999

[54] METHOD FOR FORMING HIGH CONTRAST ALIGNMENT MARKS

[75] Inventors: Chao-Chieh Tsai, Taichung; Shun-Liang Hsu, Hsin-Chu; Tsu Shih, Chawang, all of Taiwan

[73] Assignee: Taiwan Semiconductor Manufacturing Company, Ltd., Hsin-Chu, Taiwan

[*] Notice: The term of this patent shall not extend beyond the expiration date of Pat. No. 5,705,520.

[21] Appl. No.: 730,382

[22] Filed: Oct. 16, 1996

[51] Int. Cl.⁶ .................................................. H01L 21/76
[52] U.S. Cl. .......................... 438/401; 438/636; 438/637; 438/688; 438/698; 438/462; 438/699; 438/702; 438/703
[58] Field of Search ...................... 437/70, 228; 438/712, 438/401, 462, 636, 637, 688, 694, 699, 702, 703

[56] References Cited

U.S. PATENT DOCUMENTS

| | | | |
|---|---|---|---|
| 4,677,043 | 6/1987 | Cordes, III et al. | 430/22 |
| 5,118,639 | 6/1992 | Roth et al. | 437/41 |
| 5,271,798 | 12/1993 | Sandhu et al. | 156/638 |
| 5,316,966 | 5/1994 | Van Der Plas et al. | 437/70 |
| 5,401,691 | 3/1995 | Caldwell | 437/228 |
| 5,705,320 | 1/1998 | Hsu et al. | 430/313 |

*Primary Examiner*—Charles Bowers
*Assistant Examiner*—Renee'R. Berry
*Attorney, Agent, or Firm*—George O. Saile; Stephen B. Ackerman; Larry J. Prescott

[57] ABSTRACT

A method of forming high contrast alignment marks on an integrated circuit wafer for patterning a layer of highly reflective electrode metal is described. A method of patterning a layer of highly reflective metal on an integrated circuit wafer using high contrast alignment marks is also described. Due to a difference in height of alignment marks and contact metal surrounding the alignment marks the alignment marks are transferred to the contour of the highly reflective electrode metal. A non reflective layer of bottom anti-reflection coating material is then used to provide high contrast at the location where the edges of the alignment marks are transferred to the highly reflective electrode metal.

20 Claims, 9 Drawing Sheets

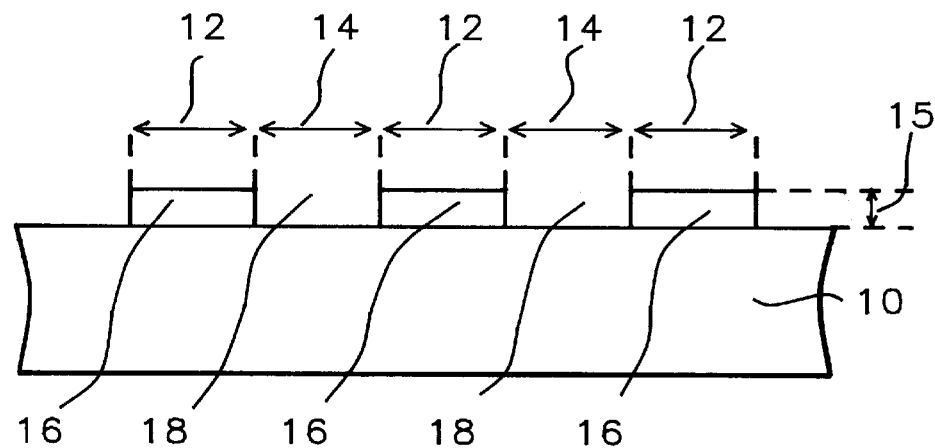
FIG. 1A – Prior Art
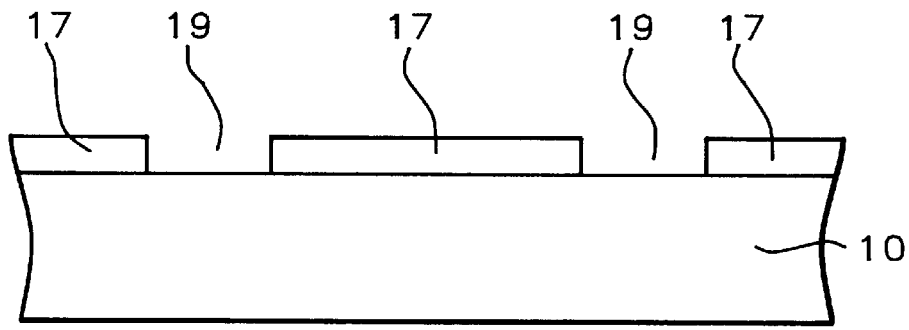
FIG. 1B – Prior Art
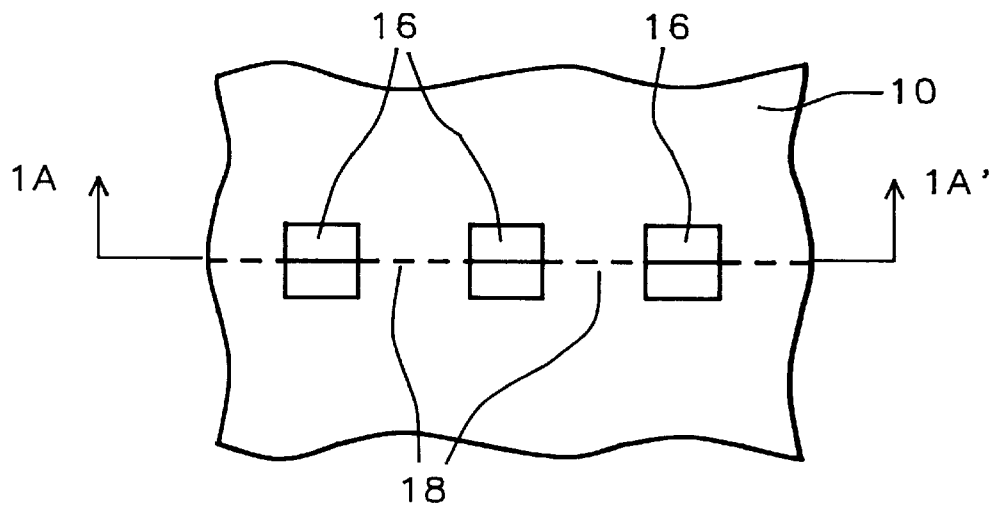
FIG. 1C – Prior Art

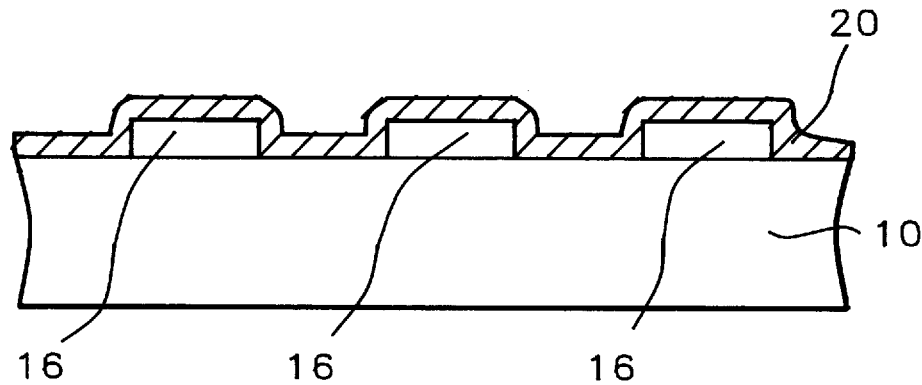
FIG. 2A- Prior Art
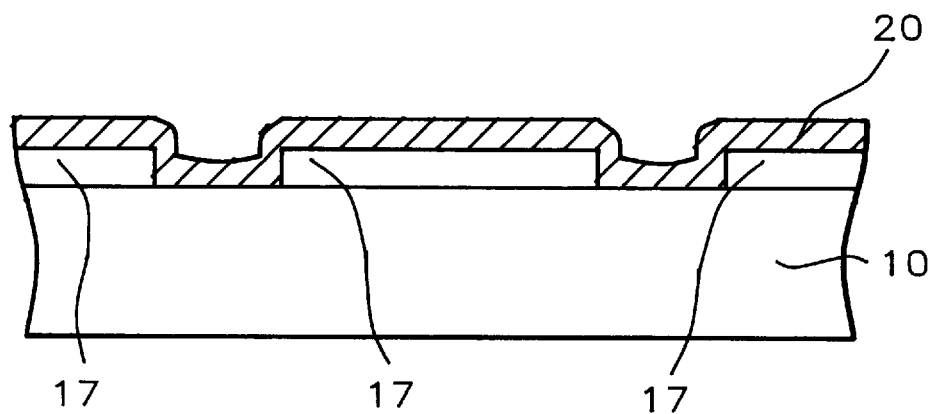
FIG. 2B- Prior Art

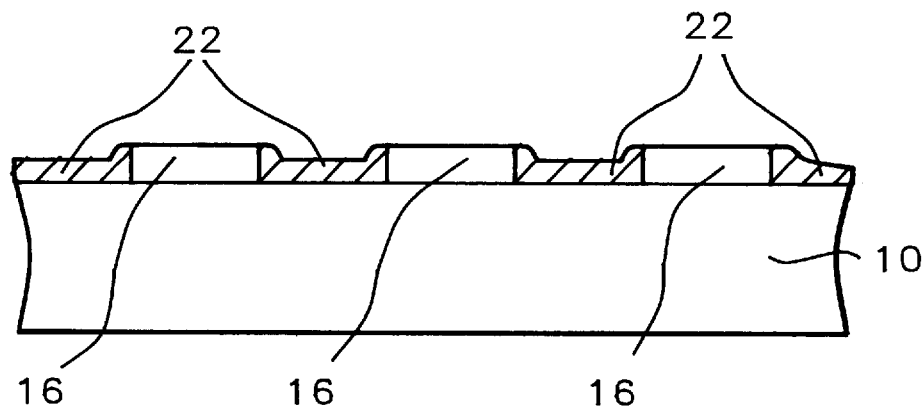
FIG. 3A- Prior Art
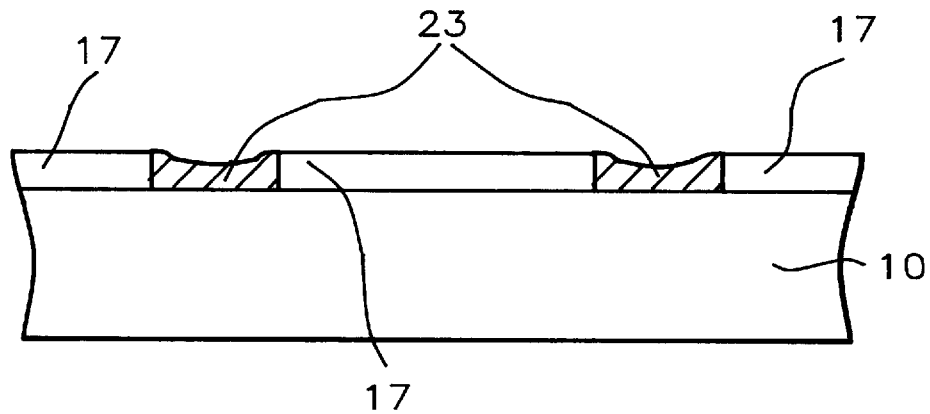
FIG. 3B- Prior Art

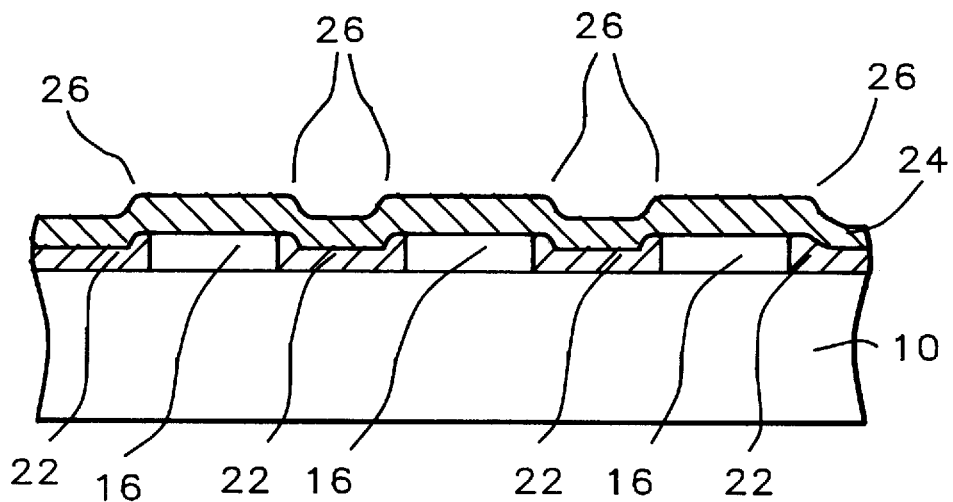
FIG. 4A – Prior Art
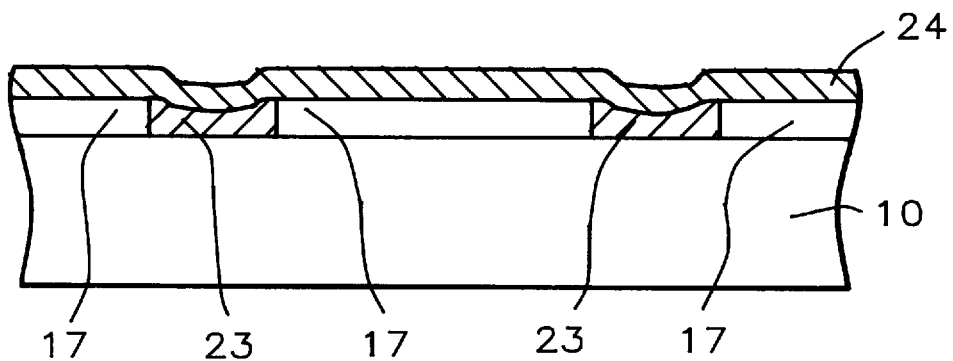
FIG. 4B – Prior Art

METHOD FOR FORMING HIGH CONTRAST ALIGNMENT MARKS

BACKGROUND OF THE INVENTION

(1) Field of the Invention

This invention relates to the formation of high contrast alignment marks for patterning highly reflective electrode metal layers and more particularly to the use of back anti-reflection coating material to improve the contrast of alignment marks.

(2) Description of the Related Art (TSMC-96-120) Ser. No. 08/742,229, filed Oct. 31, 1996by Shih et al. and assigned to the same assignee describes the use of back etching to preserve alignment marks formed in a layer of dielectric.

U.S. Pat. No. 5,401,691 to Caldwell describes a method of forming and preserving alignment marks through integrated circuit processing steps. The invention does not discuss methods of improving the optical contrast of the alignment marks.

U.S. Pat. No. 5,271,798 to Sandhu et al. describes a method for etching localized regions of an integrated circuit wafer to remove tungsten from alignment marks.

U.S. Pat. No. 5,316,966 to Van Der Plas et al. describes a method of forming alignment marks by etching marks into the integrated circuit wafer and filling the etched marks with thermal oxide. The invention does not discuss methods of improving the optical contrast of the alignment marks.

The invention described in this patent application describes a method of forming alignment marks which can be used to pattern a layer of highly reflective electrode metal. The alignment marks cause depressions in the surface of the layer of electrode metal. These depressions are filled with an optically non reflective material thereby greatly increasing the contrast of the alignment marks. The high contrast of the alignment marks makes them highly visible and easy to locate using automatic means.

SUMMARY OF THE INVENTION

Photolithographic process steps are of critical importance in the manufacture of semiconductor integrated circuits. These process steps comprise passing a light beam through a projection mask containing an image to be transferred to a semiconductor wafer and focussing the image on a photosensitive layer formed on the semiconductor wafer. These processes steps typically use a tool such as a projection stepper, which may also be a reduction stepper which reduces the image as it is focussed on the semiconductor wafer. In order to carry out these process steps there must be means to align the focussed image with the wafer so that all process steps are properly aligned with the wafer. This means usually comprises alignment marks formed on the wafer which can be sensed by the five times reduction stepper.

A set of conventional alignment marks used for the formation of metal contacts and the first metal electrode layer is shown in FIGS. 1A–1C. The wafer 10 is primarily regions in which integrated circuits or the like will be formed, however each wafer will have a number, usually two, of alignment regions. The alignment marks for aligning the mask image to the wafer are formed in the alignment regions. FIG. 1A shows a cross section of part of one of the alignment regions and FIG. 1B shows a cross section of part of one of the integrated circuit regions of the wafer.

As shown in FIG. 1A the alignment marks are formed using geometric shapes 16, in this example squares, formed in a dielectric, in this example silicon dioxide, with spaces 18 between adjacent geometric shapes. FIG. 1C shows a top view of this part of the alignment region showing the dielectric squares 16 with spaces 18 between adjacent squares formed on the wafer 10. The cross section view of a part of one of the alignment regions shown in FIG. 1A is taken along line 1A—1A' of FIG. 1C. FIG. 1B shows a part of one of the integrated circuit regions showing a layer of dielectric 17, in this example silicon dioxide, formed on the wafer 10 with contact openings 19 formed in the dielectric.

FIGS. 2A shows a cross section view of this part of one of the alignment regions and FIG. 2B shows a cross section view of this part of one of the integrated circuit regions after a layer of contact metal 20, in this example tungsten, has been deposited. Next as shown in FIGS. 3A and 3B the wafer is planarized, in this example using chemical mechanical polishing, leaving contact metal 22 in those parts of the alignment regions non covered by dielectric 16, see FIG. 3A, and contact metal 23 in the contact openings in the integrated circuit regions. The thickness of the contact metal 22 and 23 is less than the thickness of the dielectric 16 and 17.

Next, as shown in FIGS. 4A and 4B a layer of electrode metal 24, in this example aluminum, is formed over the dielectric 16 and 17 and the contact metal 22 and 23 formed in the integrated circuit regions and alignment regions of the wafer. The next step is to pattern the layer of electrode metal 24 using photolithographic methods. To use these photolithographic methods the alignment marks 16 in the alignment regions must be used, see FIG. 4A. As shown in FIG. 4A, the thickness of the contact metal 22 in the alignment regions is less than the thickness of the dielectric in the contact regions and the edges 26 of the alignment marks 16 are transferred to the layer of electrode metal 24. These edges 26 of the alignment marks can be used to align the mask in the projection stepper for the patterning of the electrode metal layer. A key problem with this method, however, is that the reflectivity of the layer of electrode metal 24 is very high, about 99%, making the detection of the edges 26 of the alignment marks 16 very difficult. This high reflectivity of the layer of electrode metal 26 makes the contrast between the alignment marks and surrounding regions very poor and adversely affects the accuracy of the patterning of the layer of electrode metal.

It is an objective of this invention to provide a method of forming high contrast alignment marks in the wafer alignment regions which are easily detected for patterning layers of high reflectivity metal on integrated circuit wafers.

It is a further objective of this invention to provide a method of accurately patterning layers of high reflectivity metal on integrated circuit wafers using high contrast alignment marks.

These objectives are achieved by using highly absorptive bottom antireflection coating material, BARC, to fill the depressions in the highly reflective layer of electrode metal. These depressions in the highly reflective layer of electrode metal form between adjacent alignment marks because the thickness of the layer of contact metal is less than the thickness of the dielectric used to from the alignment marks.

BRIEF DESCRIPTION OF THE DRAWINGS

FIG. 1A shows a cross section view of one of the alignment regions of an integrated circuit wafer showing the dielectric alignment marks.

FIG. 1B shows a cross section view of one of the integrated circuit regions of an integrated circuit wafer showing contact openings in a dielectric layer.

FIG. 1C shows a top view of the part of the alignment region shown in FIG. 1A.

FIG. 2A shows a cross section view of one of the alignment regions of an integrated circuit wafer after a layer of contact metal has been deposited.

FIG. 2B shows a cross section view of one of the integrated circuit regions of an integrated circuit wafer after a layer of contact metal has been deposited.

FIG. 3A shows a cross section view of one of the alignment regions of an integrated circuit wafer after the wafer has been planarized.

FIG. 3B shows a cross section view of one of the integrated circuit regions of an integrated circuit wafer after the wafer has been planarized.

FIG. 4A shows a cross section view of one of the alignment regions of an integrated circuit wafer after a layer of highly reflective electrode metal has been deposited.

FIG. 4B shows a cross section view of one of the integrated circuit regions of an integrated circuit wafer after a layer of highly reflective electrode metal has been deposited.

DESCRIPTION OF THE PREFERRED EMBODIMENTS

Figure 5A:
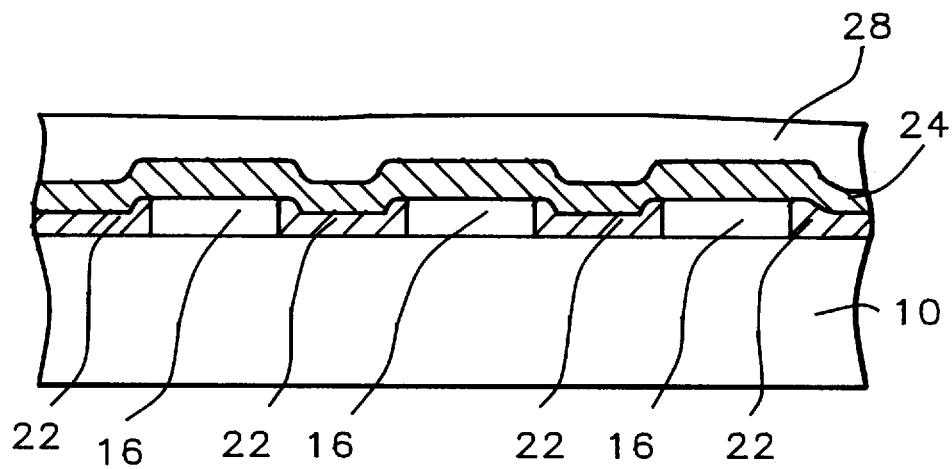
FIG. 5A shows a cross section view of one of the alignment regions of an integrated circuit wafer after a layer of bottom antireflection coating material has been deposited over the layer of highly reflective electrode metal.

FIG. 1A shows a cross section of a part of one of the alignment regions of an integrated circuit wafer. The alignment regions have dielectric alignment marks 16 formed on the silicon wafer 10. In this example the alignment marks are square as can be seen from the top view of this part of the alignment region shown in FIG. 1C. The alignment marks 16 are square wherein the sides 12 have a length of between about 6 and 10 microns. The nearest sides of adjacent alignment marks 16 have a space 18 between them of between about 6 and 10 microns. The alignment marks 16 are formed of silicon dioxide and have a thickness 15 of between about 0.8 and 1.2 microns.

Figure 8A:
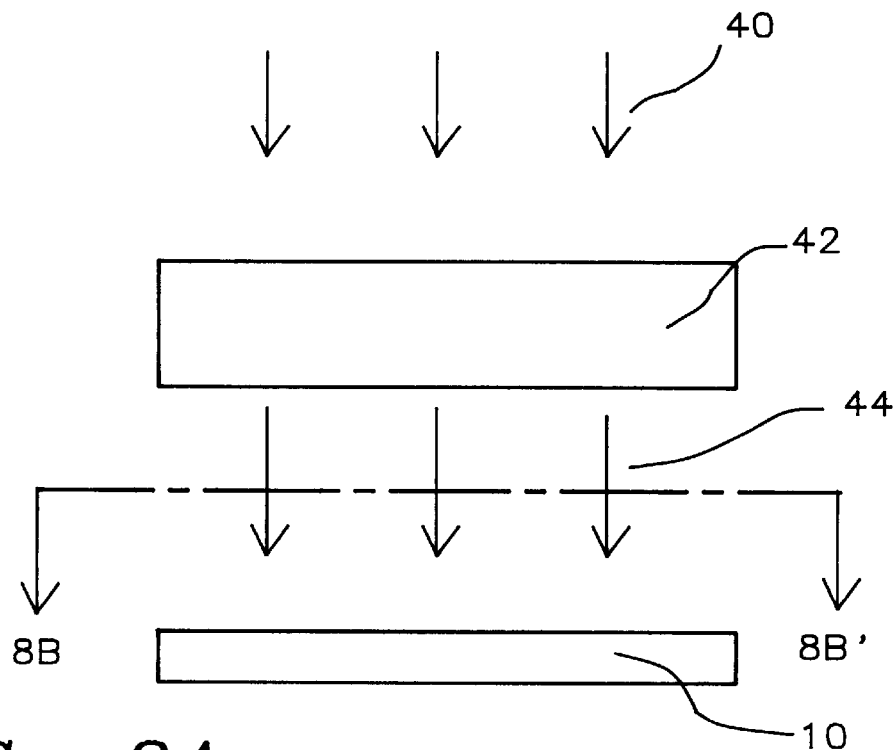
FIG. 8A shows a block diagram of a five times reduction stepper exposing a wafer.
Figure 8B:
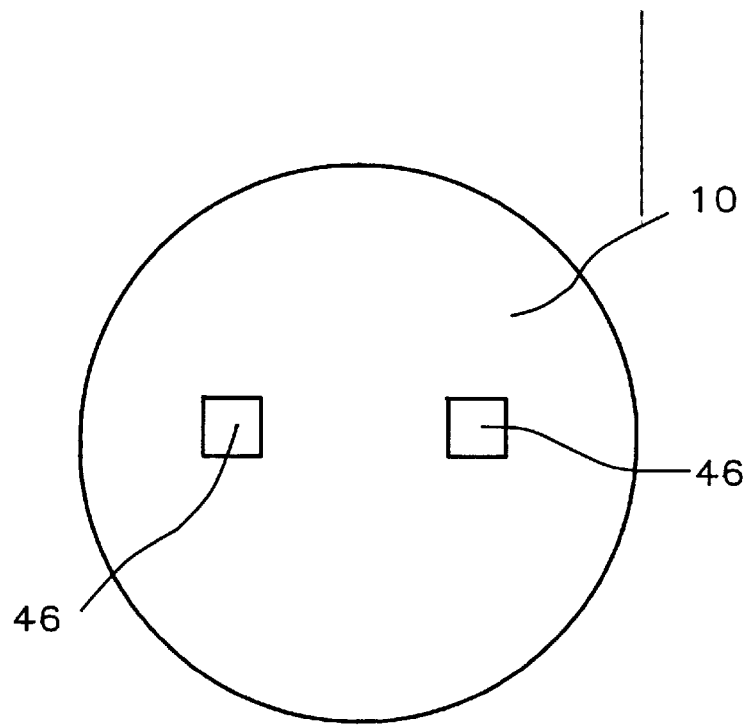
FIG. 8B shows a top view of the wafer being exposed using the five times reduction stepper looking along line 8B—8B' of FIG. 8A.

FIG. 1B shows a cross section view of a part of one of the integrated circuit regions of the wafer 10. FIG. 8B shows how the alignment regions 46 and the integrated circuit regions are arranged on the wafer. In this example there are two alignment regions 46 spaced so that alignment marks formed in each alignment region can provide alignment for the entire wafer 10. The integrated circuit regions of the wafer cover that part of the wafer not occupied by the alignment regions. The integrated circuits are formed in the integrated circuit regions of the wafer.

FIG. 1B shows a cross section view of part of one of the integrated circuit sections of the wafer. Of course, the alignment regions of the wafer and the integrated circuit regions of the wafer are processed simultaneously. FIG. 1B shows a dielectric layer 17, in this example silicon dioxide, having contact holes 19 formed therein. The dielectric layer 17 in the integrated circuit regions of the wafer is the same dielectric layer from which the alignment marks 16 are formed in the alignment regions of the wafer, see FIG. 1A.

Next, as shown in FIGS. 2A and 2B, a layer of contact metal 20 is formed on the wafer 10 covering both the alignment regions, shown in FIG. 2A, and the integrated circuit regions, shown in FIG. 2B. The contact metal 20 has a thickness less than the thickness of the dielectric markers 16, see FIG. 1A. In this example the contact metal 20 is tungsten having a thickness of between about 4000 and 6000 Angstroms. FIG. 2B shows the layer of contact metal 20 formed over the dielectric layer 17 and the contact holes formed in the dielectric layer in the integrated circuit regions of the wafer.

Next, as shown in FIGS. 3A and 3B, the wafer is planarized. In this example the planarization is accomplished using chemical mechanical polishing however other methods, such as back etching, could be used could be used depending on the nature of the contact metal. FIG. 3B shows the alignment region after the planarization of the wafer showing contact metal 22 adjacent to the sides of the alignment marks. FIG. 3B shows the integrated circuit region of the wafer showing contact metal 23 filling the contact holes in the dielectric layer 17.

Next, as shown in FIGS. 4A and 4B, a layer of electrode metal 24, such as aluminum is formed over the wafer. FIG. 4A shows the alignment region after the electrode metal 24 has been deposited. As can be seen in FIG. 4A, the contour of the layer of electrode metal 24 follow the contour of the alignment marks 26 since the thickness of the contact metal 22 is less than the thickness of the alignment marks 16. The edges of the alignment marks will be transferred to edges 26 in the layer of electrode metal. These edges 26 can be used for the next alignment step but the high reflectivity of the electrode metal, about 99%, makes it very difficult to determine the location of the edges 26. FIG. 4B shows a cross section of the integrated circuit region of the wafer after the layer of electrode metal 24 has been deposited.

Figure 5B:
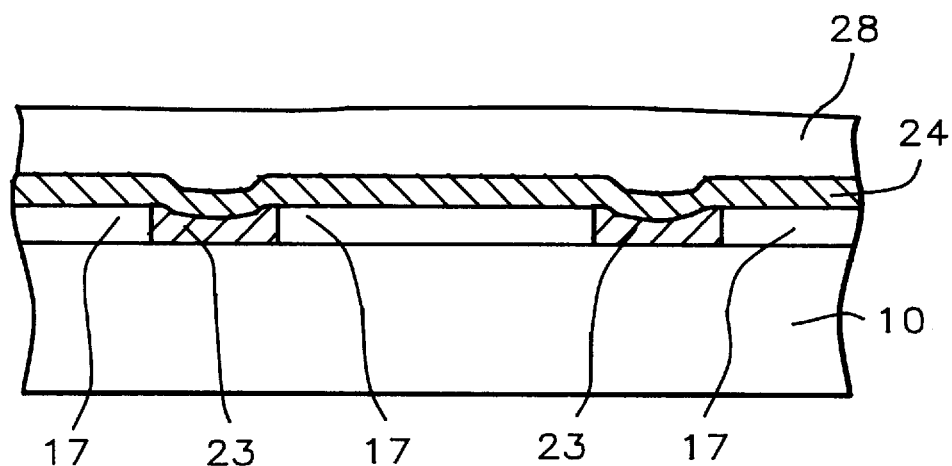
FIG. 5B shows a cross section view of one of the integrated circuit regions of an integrated circuit wafer after a layer of bottom antireflection coating material has been deposited over the layer of highly reflective electrode metal.

Next, as shown in FIGS. 5A and 5B, a layer of material 28 which is non reflective for the wavelength of light used to align the projection masks to the wafer is formed on the wafer, in this example 6300 Angstroms. FIG. 5A shows a cross section of a part of one of the alignment regions and FIG. 5B shows a cross section of one of the integrated circuit regions. The non reflective material 28 is bottom anti-reflection coating material such as dyed photoresist and has a reflectivity of less than 1% for light having a wavelength of 6300 Angstroms.

Figure 6A:
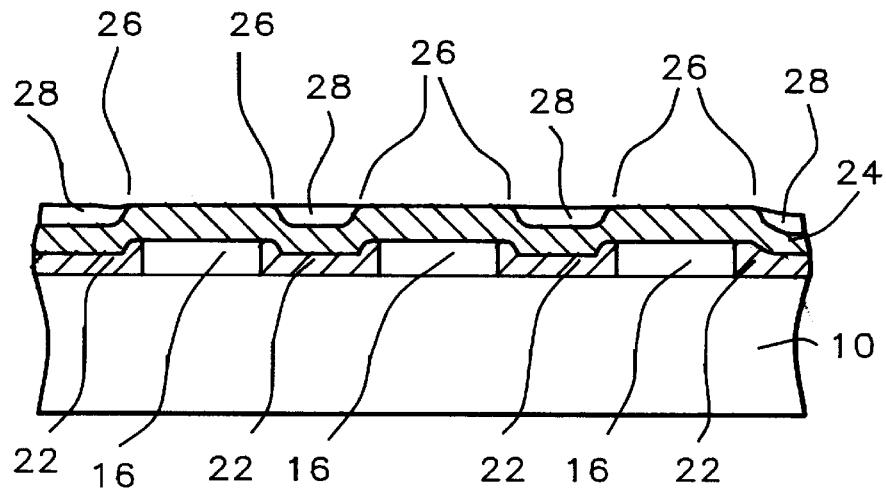
FIG. 6A shows a cross section view of one of the alignment regions of an integrated circuit wafer after a layer of bottom antireflection coating material has been deposited over the layer of highly reflective electrode metal and back etched.
Figure 6B:
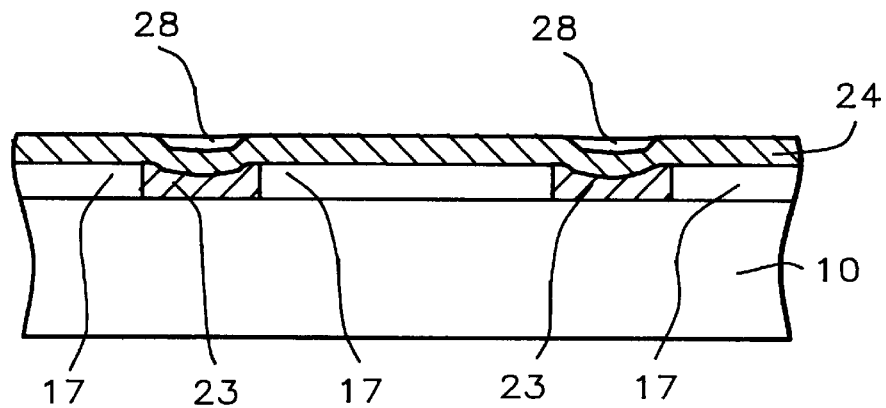
FIG. 6B shows a cross section view of one of the integrated circuit regions of an integrated circuit wafer after a layer of bottom antireflection coating material has been deposited over the layer of highly reflective electrode metal and back etched.

Next, as shown in FIGS. 6A and 6B, the non reflective material is etched back using dry etching such as an oxygen plasma etch. As shown in FIG. 6A, non reflective material 28 is left in the depressions in the layer of electrode metal 24 around the alignment marks due to the thickness difference between the alignment marks 16 and the contact metal 22. There will now be a large difference in reflectivity at the locations 26 where the edges of the alignment marks 16 are transferred to the layer of electrode metal 24. These alignment marks will now be visible and can be used to align the wafer for subsequent processing. FIG. 6B shows a cross section of a part of one of the integrated circuit regions of the wafer showing non reflective material in the depressions in the layer of electrode metal 24 formed over the contact metal 23 filling the contact holes in the layer of dielectric 17.

Figure 7A:
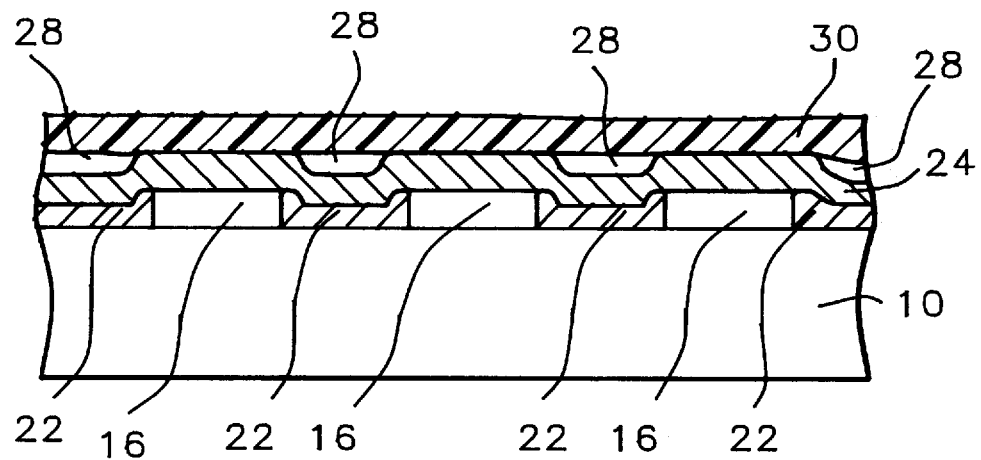
FIG. 7A shows a cross section view of one of the alignment regions of an integrated circuit wafer after a layer of photoresist has been deposited over the layer of highly reflective electrode metal and back etched bottom antireflection coating material.
Figure 7B:
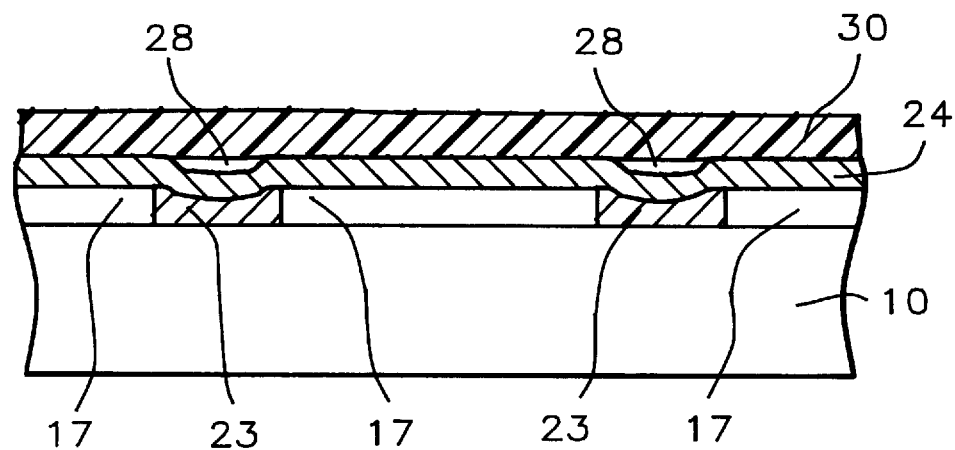
FIG. 7B shows a cross section view of one of the integrated circuit regions of an integrated circuit wafer after a layer of photoresist has been deposited over the layer of highly reflective electrode metal and back etched bottom antireflection coating material.

Next, as shown in FIGS. 7A and 7B, a layer of photoresist 30 is formed over the wafer 10. FIG. 7A shows a cross section of a part of one of the alignment regions of the wafer and FIG. 7B shows a cross section of a part of one of the integrated circuit regions of the wafer. Next the photoresist is exposed with a pattern to be transferred to the layer of electrode metal using a tool such as a projection stepper, shown in block diagram form in FIG. 8A. A projection mask having the pattern to be transferred to the layer of electrode metal is held in the projection stepper 42 and illuminated with a light beam 40. In this example light having a wavelength of 6300 Angstroms is used but those skilled in the art will readily recognize that other wavelengths can be used. The light passing through the mask 44 is then focussed on the wafer 10 using the alignment marks in the alignment region. The contrast provided by the non reflective material and the reflective electrode metal layer in the alignment regions improves the accuracy of the alignment of the mask to the wafer by the stepper and makes automatic alignment possible. FIG. 8B shows the location of alignment regions 46 on a wafer 10 for the case where two alignment regions on a wafer are used.

Figure 9A:
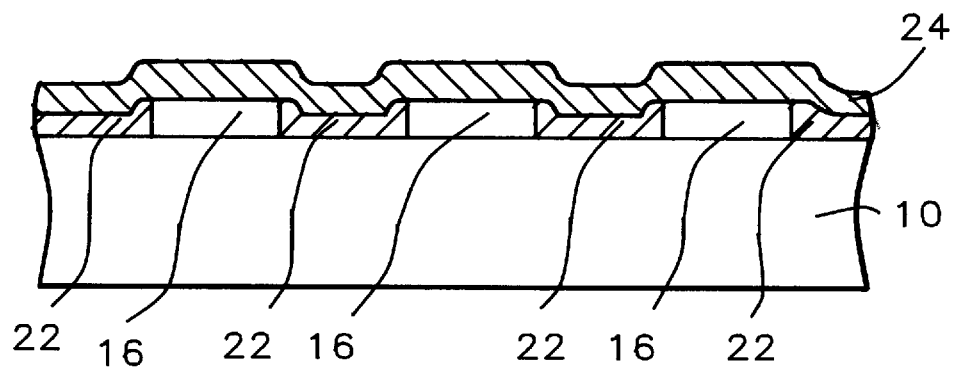
FIG. 9A shows a cross section view of one of the alignment regions of an integrated circuit wafer after the photoresist and bottom antireflection coating material has been removed.
Figure 9B:
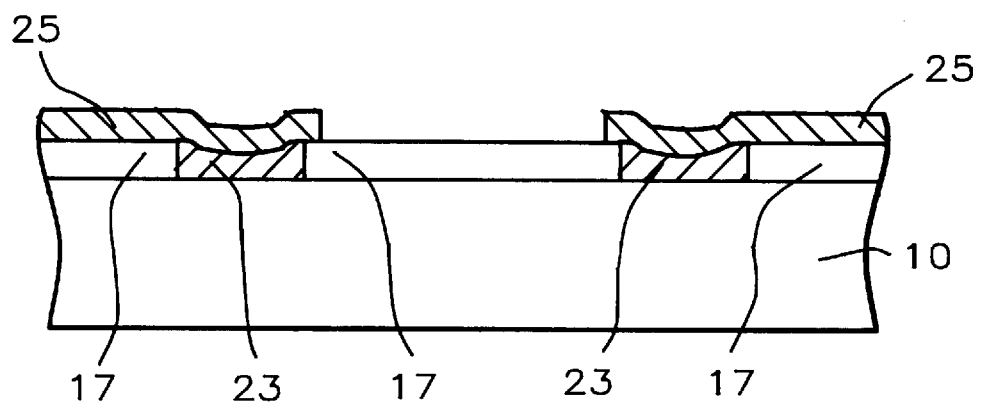
FIG. 9B shows a cross section view of one of the integrated circuit regions of an integrated circuit wafer after the photoresist and bottom antireflection coating material has been removed and the layer of electrode metal has been patterned.

Next, the photoresist is exposed and developed and the mask pattern is transferred to the photoresist. Using the photoresist as a mask the pattern is then formed in the layer of electrode metal. Next, as shown in FIGS. 9A and 9B, the photoresist and the non reflection material are then removed. FIG. 9A shows a cross section view of a part of one of the alignment regions of the wafer. FIG. 9B shows a cross section view of a part of one of the integrated circuit regions of the wafer showing the patterned layer of electrode metal 25.

While the invention has been particularly shown and described with reference to the preferred embodiments thereof, it will be understood by those skilled in the art that various changes in form and details may be made without departing from the spirit and scope of the invention.

What is claimed is:

1. A method of forming high contrast alignment marks, comprising the steps of:

providing a semiconductor wafer having a first surface;

providing alignment regions and device regions within said semiconductor wafer wherein each said alignment region consists of a first region and a second region;

forming a dielectric layer having a first thickness on said first surface of said conductor wafer;

patterning said dielectric layer thereby forming contact openings in that part of said dielectric layer in said device regions, removing that part of said dielectric layer over said second region of each of said alignment regions, leaving that part of said dielectric layer directly over said first region of each of said alignment regions forming dielectric alignment makers wherein said dielectric alignment markers have a height equal to said first thickness;

forming a layer of first metal having second thickness on said semiconductor wafer after forming said contact openings and said dielectric alignment markers wherein said layer of first metal contacts said first surface of said semiconductor wafer in said contact openings, said layer of first metal contacts said first surface of said semiconductor wafer in said second region of each of said alignment regions, and said second thickness is less than said first thickness;

removing that part of said layer of first metal which is equal to or greater than said first thickness away from said first surface of said semiconductor wafer thereby removing said first metal from said patterned dielectric and leaving said second thickness of said first metal in said contact openings and said second region of each of said alignment regions;

forming a layer of second metal over said semiconductor wafer after removing that part of said layer of first metal which is equal to or greater than said first thickness away from said first surface of said semiconductor wafer thereby forming first depressions in said layer of second metal over said first region of each of said alignment regions and second depressions in said layer of second metal over said contact openings because said first thickness is greater than said second thickness;

forming a layer of bottom anti-reflective coating material over said layer of second metal thereby filling said first depressions and said second depressions with said bottom anti-reflective coating material; and back etching said layer of bottom anti-reflective coating material thereby leaving bottom anti-reflective coating material only in said first depressions and said second depressions wherein said bottom anti-reflective coating material in said first depressions form high contrast alignment marks.

2. The method of claim 1 wherein said first thickness is between about 0.8 and 1.2 microns.

3. The method of claim 1 wherein said first metal is tungsten.

4. The method of claim 1 wherein said second metal is aluminum.

5. The method of claim 1 wherein said dielectric alignment marks are squares having sides of between about 6 and 10microns and the distance between adjacent sides of adjacent squares within one of said alignment regions is between about 6 and 10 microns.

6. The method of claim 1 wherein removing that part of said layer of first metal which is equal to or greater than said first thickness away from said first surface of said semiconductor wafer is accomplished by means of chemical mechanical polishing.

7. The method of claim 1 wherein said dielectric layer is silicon dioxide.

8. The method of claim 1 wherein said bottom anti-reflective coating material is dyed photoresist.

9. The method of claim 1 wherein said back etching of said bottom anti-reflective coating material is accomplished by means of oxygen plasma etching.

10. The method of claim 1 wherein said bottom anti-reflective coating material absorbs at least 95% of light having a wavelength of about 6300 Angstroms.

11. A method of forming conductor metal patterns using high contrast alignment marks, comprising the steps of:

providing a semiconductor wafer having a first surface;

providing alignment regions and device regions within said semiconductor wafer wherein each said alignment region consists of a first region and a second region;

forming a dielectric layer having a first thickness on said first surface of said semiconductor wafer;

patterning said dielectric layer thereby forming contact openings in that part of said dielectric layer in said device regions, removing that part of said dielectric layer over said second region of each of said alignment regions, leaving that part of said dielectric layer directly over said first region of each of said alignment regions forming dielectric alignment markers wherein said dielectric alignment markers have a height equal to said first thickness;

forming a layer of first metal having a second thickness on said semiconductor wafer after forming said contact openings and said dielectric alignment markers wherein said layer of first metal contacts said first surface of said semiconductor wafer in said contact openings, said layer of first metal contacts said first surface of said semiconductor wafer in said second region of each of said alignment regions, and said second thickness is less than said first thickness;

removing that part of said layer of first metal which is equal to or greater than said first thickness away from said first surface of said semiconductor wafer thereby removing said first metal from said patterned dielectric and leaving said second thickness of said first metal in said contact openings and said second region of each of said alignment regions;

forming a layer of second metal over said semiconductor wafer after removing that part of said layer of first metal which is equal to or greater than said first thickness away from said first surface of said semiconductor wafer thereby forming first depressions in said layer of second metal over said first region of each of said alignment regions and second depressions in said layer of second metal over said contact openings because said first thickness is greater than said second thickness;

forming a layer of bottom anti-reflective coating material over said layer of second metal thereby filling said first depressions and said second depressions with said bottom anti-reflective coating material;

back etching said layer of bottom anti-reflective coating material thereby leaving bottom anti-reflective coating material only in said first depressions and said second depressions wherein said bottom anti-reflective coating material in said first depressions form high contrast alignment marks;

forming a layer of photoresist over said layer said layer of second metal after filling said first depressions and said second depressions with said bottom anti-reflective coating material;

providing a projection stepper;

providing a projection mask having a conductor pattern;

exposing said conductor pattern in said layer of photoresist using said projection stepper, said projection mask, and said high contrast alignment marks;

developing said layer of photoresist thereby forming a photoresist mask having said conductor pattern;

etching away that part of said layer of second metal not covered by said photoresist mask; and removing said photoresist mask and said bottom anti-reflective coating material.

12. The method of claim 11 wherein said first thickness is between about 0.8 and 1.2 microns.

13. The method of claim 11 wherein said first metal is tungsten.

14. The method of claim 11 wherein said second metal is aluminum.

15. The method of claim 11 wherein said dielectric alignment marks are squares having sides of between about 6 and 10microns and the distance between adjacent sides of adjacent squares within one of said alignment regions is between about 6 and 10 microns.

16. The method of claim 11 wherein removing that part of said layer of first metal which is equal to or greater than said first thickness away from said first surface of said semiconductor wafer is accomplished by means of chemical mechanical polishing.

17. The method of claim 11 wherein said dielectric layer is silicon dioxide.

18. The method of claim 11 wherein said bottom anti-reflective coating material is dyed photoresist.

19. The method of claim 11 wherein said back etching of said bottom anti-reflective coating material is accomplished by means of oxygen plasma etching.

20. The method of claim 11 wherein said bottom anti-reflective coating material absorbs at least 95% of light having a wavelength of about 6300 Angstroms.

* * * * *